United States Patent
Linn et al.

[11] Patent Number: 5,841,182
[45] Date of Patent: Nov. 24, 1998

[54] CAPACITOR STRUCTURE IN A BONDED WAFER AND METHOD OF FABRICATION

[75] Inventors: Jack Howard Linn, Melbourne; Gregg Douglas Croft, Palm Bay, both of Fla.

[73] Assignee: Harris Corporation, Melbourne, Fla.

[21] Appl. No.: 741,639

[22] Filed: Oct. 28, 1996

Related U.S. Application Data

[63] Continuation of Ser. No. 326,037, Oct. 19, 1994, abandoned.

[51] Int. Cl.⁶ .......................... H01L 27/108; H01L 21/02
[52] U.S. Cl. .......................... 257/532; 257/534; 257/618; 257/620
[58] Field of Search ..................... 257/401, 532, 257/534, 311, 304, 301, 305, 620, 618

[56] References Cited

U.S. PATENT DOCUMENTS

| | | | |
|---|---|---|---|
| 4,063,271 | 12/1977 | Bean et al. | 257/532 |
| 4,238,762 | 12/1980 | McWilliams et al. | 257/532 |
| 4,866,501 | 9/1989 | Shanefield | 257/532 |
| 5,151,768 | 9/1992 | Aso | 257/532 |
| 5,493,137 | 2/1996 | Satoh et al. | 257/296 |

FOREIGN PATENT DOCUMENTS

| | | | |
|---|---|---|---|
| 62-49649 | 3/1987 | Japan | 257/304 |
| 3-296265 | 12/1991 | Japan | 257/301 |
| 4-107858 | 4/1992 | Japan | 257/301 |
| 5-29574 | 2/1993 | Japan | 257/301 |

*Primary Examiner*—Donald Monin
*Attorney, Agent, or Firm*—Jaeckle Fleischmann & Mugel, LLP

[57] ABSTRACT

A bonded wafer structure has a device wafer 18 bonded to a handle wafer 10. A capacitor including a bottom plate as the surface 11 of handle wafer 10, a dielectric layer 12 and a top plate 15 is embedded in the bonded structure. A contact trench 22 extends from the surface 8 of device wafer 18 to the top plate 15 of the embedded capacitor.

23 Claims, 8 Drawing Sheets

CAPACITOR STRUCTURE IN A BONDED WAFER AND METHOD OF FABRICATION

This application is a continuation of application Ser. No. 08/326,037, filed Oct. 19, 1994 now abandoned.

BACKGROUND

Integrated circuits use capacitors for a number of applications. While small capacitors may be formed on the integrated circuit itself, often a large capacitor is required for operating the integrated circuit or for electrostatic discharge (ESD) protection. Such large capacitors are mounted on a circuit board adjacent to the integrated circuit.

For example, capacitors are commonly used to decouple power supplies from integrated circuits. Such decoupling capacitors often have a large capacitance and a low series resistance and inductance. These capacitors are mounted as close as possible to the integrated circuit to help maintain a constant supply voltage. A typical requirement for a power supply decoupling capacitor is one having a capacitance in the range of 0.01 to 1.0 microfarads capacitance. With known techniques of forming capacitance in the device layer of the semiconductor substrate, in order to provide a capacitor equivalent in capacitance to the offchip capacitor one would have to use almost the entire device area of a typical integrated circuit die. For example, calculations show that a small die (1320 microns by 1320 microns) with a dielectric thickness of 2000 Å and a dielectric constant of nine (9) would yield a capacitance of approximately 700 picofarads.

Other circuits that require large capacitors include sample and hold integrated circuits that have hold capacitors. The sample and hold integrated circuits monitor an input signal that varies with time. When the input signal is received, the circuit locks onto the instantaneous voltage at a given time and holds that voltage until the circuit is reset to receive the next sampling signal. Such circuits use relatively large onchip capacitors and in some cases require external capacitors to hold the captured voltage. The larger the capacitor the longer the integrated circuit will be able to hold the captured voltage within an acceptable range. The overall accuracy of the device can be improved by extending the time for holding the captured voltage. A typical onchip capacitor is about 70–100 picofarads and takes up a substantial area of the device surface of the integrated circuit.

A large capacitor across the supply pins could also be used in conjunction with a common dual diode input/output protection scheme to protect IC's from Human Body Model (HBM) and Machine Model (MM) ESD stresses. The capacitor in the HBM tester is 100 picofarads and the capacitor in the MM tester is 200 picofarads. A large on-chip capacitor of 700 picofarads with low inductance and resistance would have the affect to reduce HBM voltages to one-eight their initial value and MM to two-ninths of their original value due to charge sharing between the two capacitors. This could allow units that previously failed at 300 V HBM to achieve 2400 V HBM before they fail. However, as the inductance and resistance rises, the ESD voltage protection decreases.

For any of the above circuits and applications, there are advantages in having an onchip capacitor. An onchip capacitor has a lower series resistance and lower inductance. This is especially important when an integrated circuit has a very high output current and/or multiple outputs that can simultaneously dump current. The change in current with respect to time created by simultaneous output switching can cause a significant change in voltage with respect to time to occur in the inductance of the bond wires and package leads of the power supply pins. Such change in voltage with respect to time acts to lower the effective power supply voltage for a short period of time. If the integrated circuit had memory elements on it, the state of those memory elements could be erroneously altered, especially if the power supply voltage dropped too low. An onchip capacitor would help prevent such unwanted memory losses.

SUMMARY OF THE INVENTION

The invention is a method and apparatus for forming a relatively large onchip capacitor in a bonded wafer structure. With a bonded wafer structure, a handle wafer is joined to the device wafer. Prior to joining the two wafers together, a capacitor structure is formed on the handle wafer. As such, the capacitor structure may be as large as the die area of the integrated circuit.

More particularly, the bonded integrated circuit has an embedded capacitor. The embedded capacitor is, in a preferred embodiment, originally formed on a handle substrate. The handle substrate has two surfaces. One surface of the handle substrate is suitably doped to act as a first plate of the capacitor. A capacitor dielectric is formed on the first plate. A second plate is formed on the capacitor dielectric. The second plate may be made of a suitable doped material compatible with semiconductor processing. For example, the second plate material may be polysilicon. In one embodiment, polysilicon is deposited in an undoped form, masked, and then doped to render certain areas conductive to form the second plate of the capacitor.

The handle wafer with the polysilicon second (top) plate is joined to a device wafer. Joining takes place using one of many known techniques for bonding a handle wafer to a device wafer. In the preferred embodiment, bonding oxide of silicon dioxide is used to bond a monocrystalline silicon wafer to the polysilicon surface of the handle wafer.

As such, it is an advantage of the invention that the capacitor is within the confines of the integrated circuit but does not occupy any of the area of the active device layer. In addition, the capacitor is in close proximity to the die and does not use wire bonding to connect the capacitor to the die. As such, the inductance between the capacitor and the die is virtually eliminated thereby greatly increasing the effectiveness of the capacitor for power supply decoupling, electrostatic discharge protection, and other uses.

Accordingly, the invention provides a single large capacitor within a handle wafer of a bonded integrated circuit structure. The invention and its method of fabrication is compatible with existing semiconductor fabrication techniques. The invention provides an onchip capacitor having a dielectric surface area almost as large as the surface area of the integrated circuit, thereby eliminating the need for offchip capacitors in many integrated circuit applications.

Having briefly described the invention, further details are provided in the following detailed description and in the accompanying drawings.

DETAILED DESCRIPTION

Figure 1:
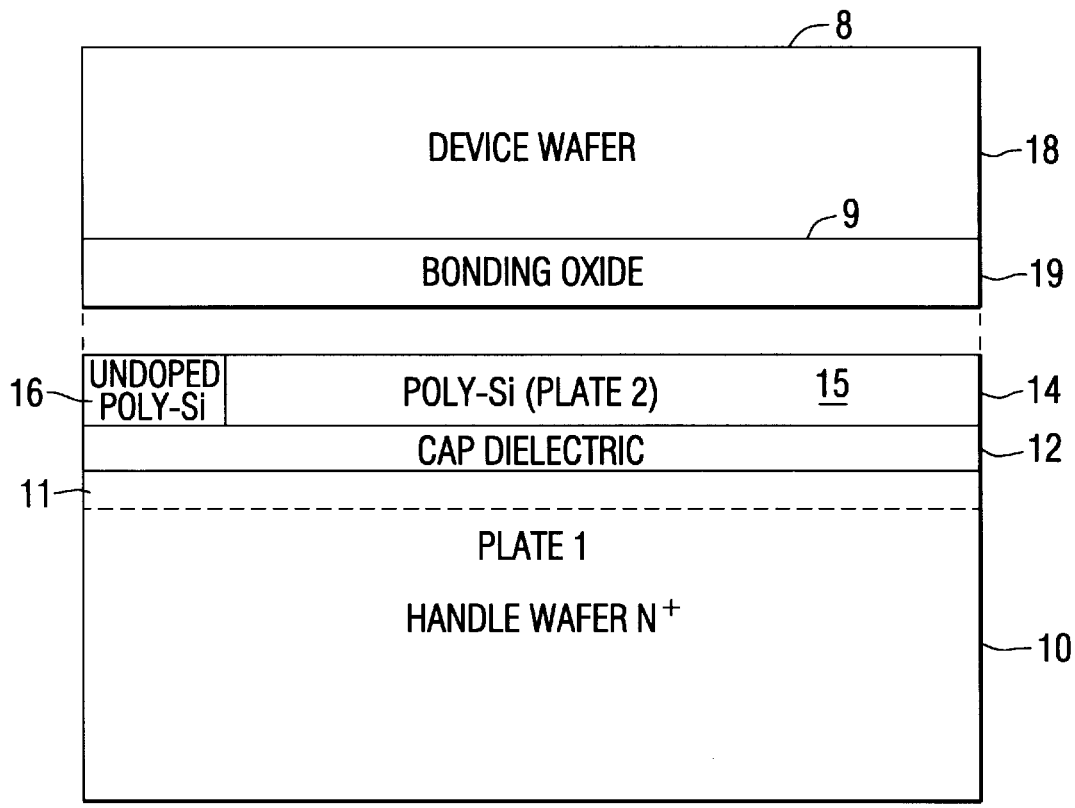
FIG. 1 is diagram of a handle wafer with a capacitor and a device wafer.

Turning to FIG. 1 there is shown a handle wafer 10. The handle wafer 10 is made of a suitable material for forming a first capacitor plate 11 on the surface of the handle wafer 10. In one embodiment of the invention the handle wafer 10 comprises a substrate of monocrystalline semiconductor material, in particular, silicon. The silicon wafer 10 is suitably doped with a heavy n-type or p-type doping. The heavy doping forms a first or bottom capacitor plate 11 on the upper surface of handle wafer 10. On top of handle wafer 10 there is formed a capacitor dielectric 12. The capacitor dielectric 12 may be any suitable layer compatible with the material of the handle wafer 10. For example, if the handle wafer 10 comprises silicon, then the capacitor dielectric 12 may comprise silicon dioxide, silicon nitride, silicon oxynitride, or diamond in crystalline or polycrystalline form.

While many materials may be used for the capacitor dielectric 12, it is preferred that the material be compatible with the manufacture of semiconductor devices as explained hereinafter. The dielectric material 12 may be formed by one of many known techniques including chemical vapor deposition, thermal oxidation, plasma assisted deposition, etc. On the capacitor dielectric layer 12 there is formed a second layer 14. The layer 14 has a conductive area 15 bounded by one or more nonconductive or insulating areas 16. In the preferred embodiment, the conductive area 15 and the nonconductive area 16 are formed of polysilicon material. The conductive area 15 is suitably doped to form the second (top) plate; the nonconductive area 16 is undoped. In a typical process, the layer 14 is deposited as a layer of undoped polysilicon. Thereafter, the polysilicon is suitably masked and then doped. A typical mask is photoresist, silicon dioxide, or silicon nitride. The mask would be suitable for preventing dopants from entering the polysilicon layer 16 beneath the mask. As such, openings in the mask would be made above the conductive or second plate region 15 while the remaining areas of the polysilicon layer 14 would be masked to shield the layer from dopants. The dopants are placed into the polysilicon layer 15 by ion implantation or diffusion.

A second device wafer 18 has a bonding surface 9 and a device surface 8. On the bonding surface 9 there is formed a suitable bonding layer 19. In the preferred embodiment, the device wafer 18 is made of monocrystalline semiconductor material, in particular silicon. The bonding layer 19 is typically a layer of silicon dioxide. The device surface 8 is the surface into which one or more integrated circuits are formed. The integrated circuits formed into device surface 8 may be formed prior to bonding of the wafer 18 to the layer 14 of wafer 10 or may be formed after the wafers 18, 10 are joined together.

Figure 2:
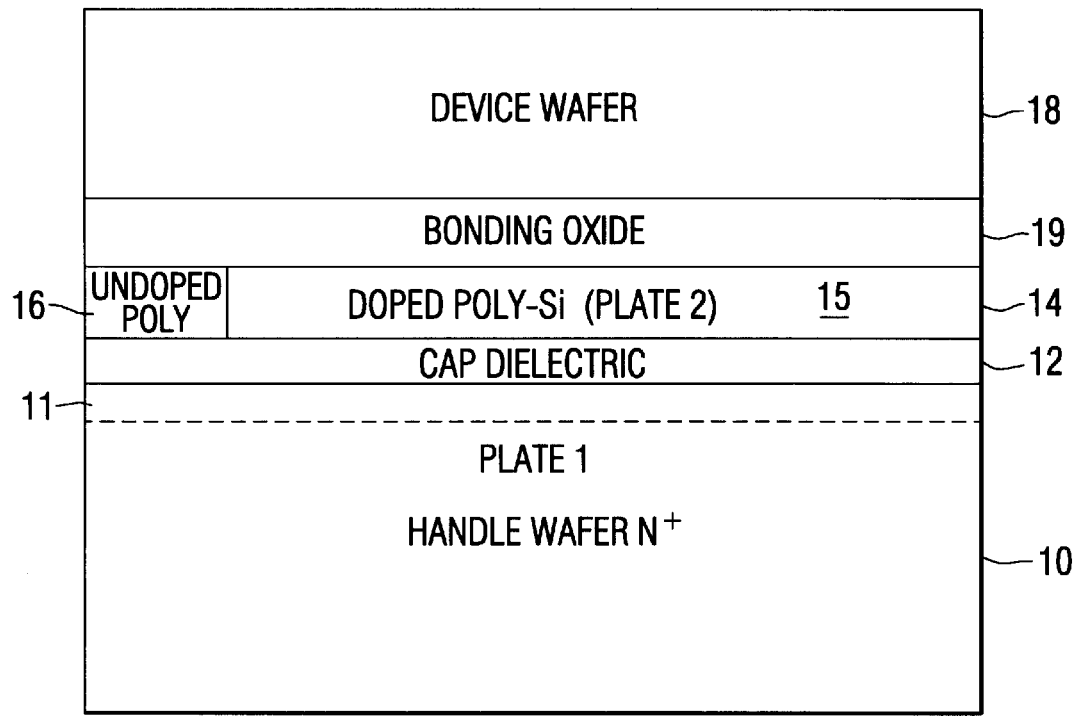
FIG. 2 is a diagram of the handle wafer and the device wafer bonded together.

Turning to FIG. 2, there is shown a composite device where the wafers 18 and 10 are joined together. The undoped nonconductive portion 16 of layer 14 provides an outer isolation region around the periphery of each die. That outer isolation region defined by material 16 will provide, as hereinafter explained, a method for electrically isolating the top or second plate 15 and thereby prevent shorting of the capacitor defined by top plate 15, dielectric layer 12 and bottom plate 11 after die separation. As such, the undoped portion 16 generally surrounds the doped portion 15 that forms the second plate of the capacitor.

Figure 3:
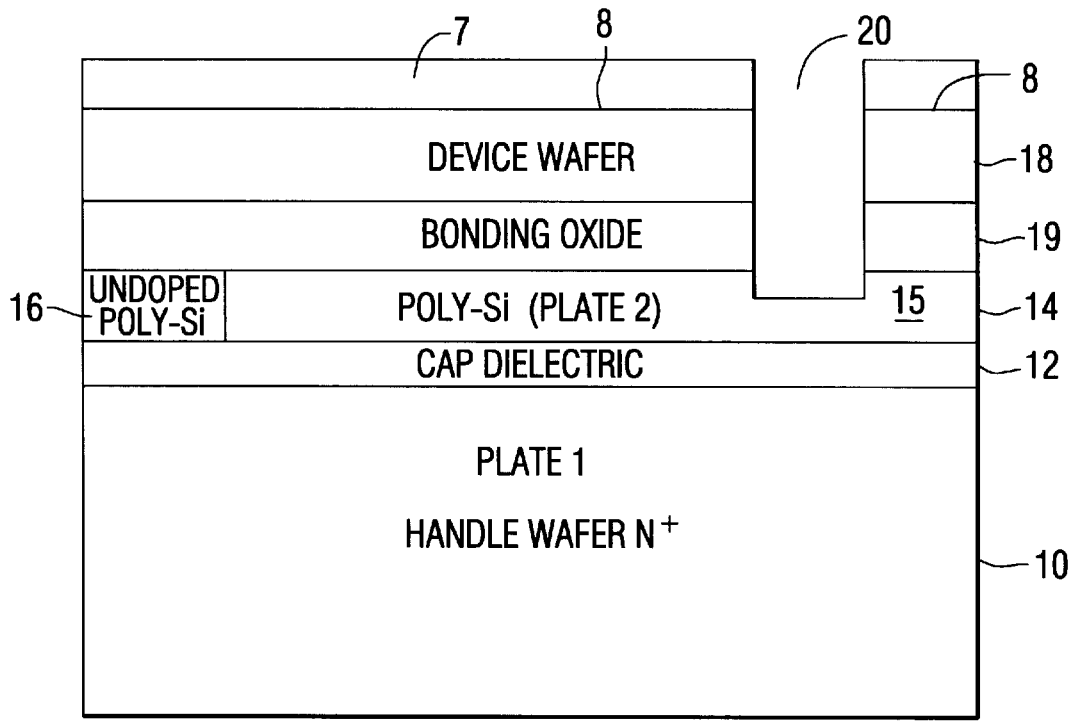
FIG. 3 is a diagram of initial steps in a trench contact process.
Figure 4:
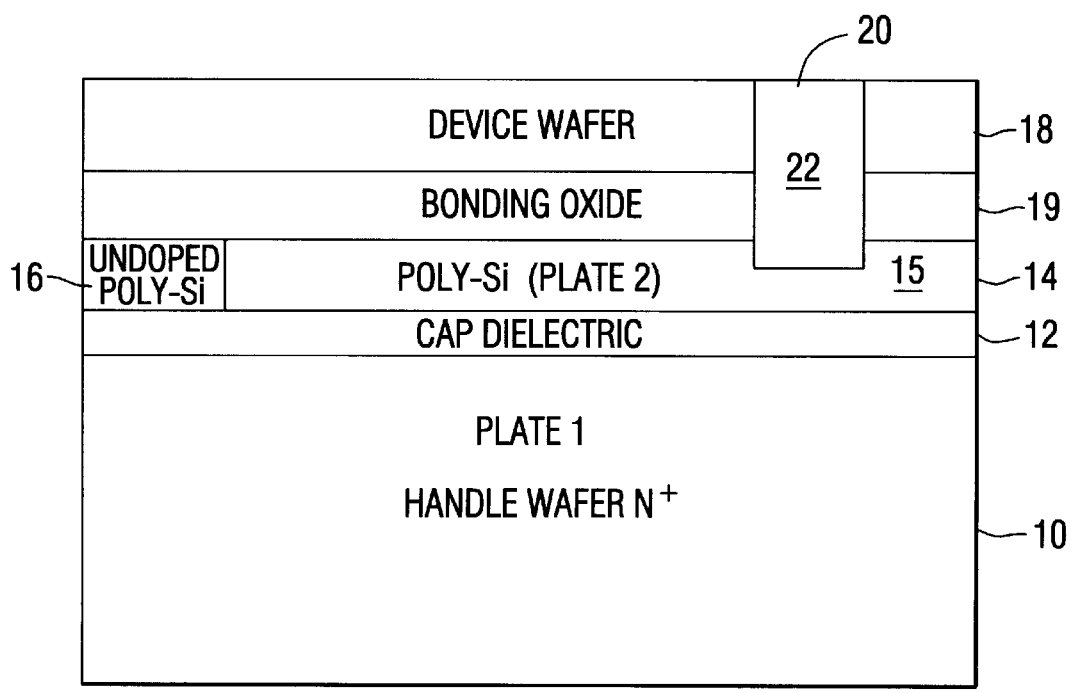
FIG. 4 is a following step in the trench contact process.

The next step provides a surface contact to the top plate 15. With reference to FIG. 3, a trench 20 is made in the device wafer 18, bonding oxide 19 and partially extends into the second plate 15 of the capacitor comprising the doped polysilicon. The trench 20 may be formed by well-known etching processes including the use of a suitable mask 7 disposed on the device wafer surface 8. The mask 7 may be formed of any suitable material or combination of materials including photo resist, silicon dioxide, or silicon nitride. Thereafter, the trench 20 is etched using a suitable etchant or combination of etchants that is selective with respect to the mask 7. It is noted that if the mask 7 is only an oxide mask, then the oxide mask 7 must be substantially larger than the bonding oxide layer 19 in order to successfully etch trench 20. It is noted that bonding oxides layers are much thinner than the layers of the masking oxides. As such, it is likely that the trench 20 can be etched using a single mask. In the event that the masking oxide is not substantially thicker than the bonding oxide, the masking oxide could be covered with photoresist prior to the oxide mask patterning. This combination of masking materials will further increase the trench etching selectivity. In addition, a silicon nitride mask could also be used to selectively etch the silicon and bonding oxide layers in trench 20. Alternatively, combinations of different etching materials can be combined with a single mask or multiple masking materials to increase the trench etch selectivity relative to the masking material. In any event, after trench 20 is etched, it is then filled with a suitable conductive material 22 as shown in FIG. 4. The material 22 may be doped polysilicon, tungsten, or tungsten silicide, or any other suitable conductive material that will establish a conductive electrical contact between the surface 8 and the second plate 15. While the drawing shows a single contact to plate 15, those skilled in the art will recognize that several other grade contacts may be added as is consistent with the design of the device formed in the device wafer 18.

Figure 5:
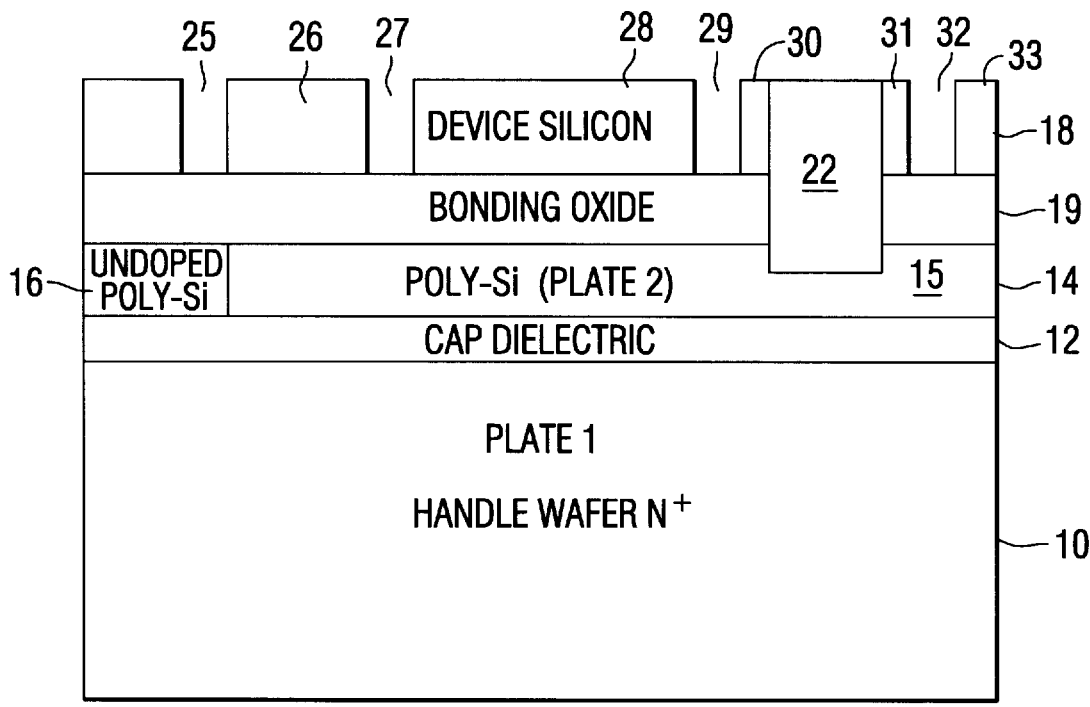
FIG. 5 shows a device isolation step.
Figure 6:
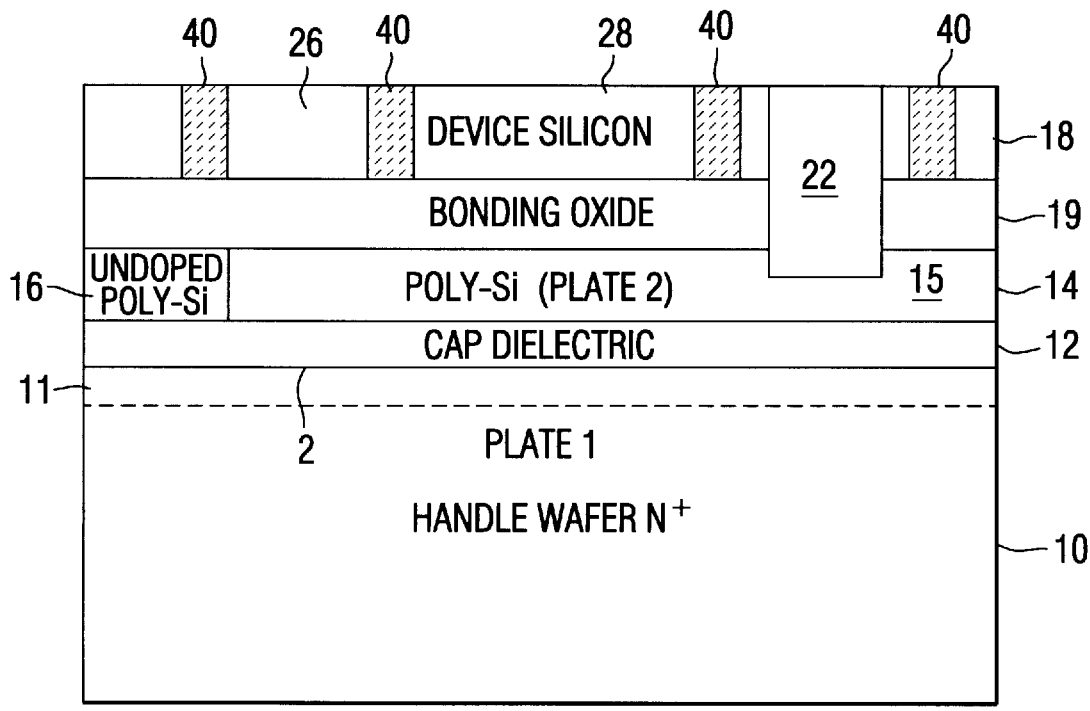
FIG. 6 is a following step in device isolation.

After the surface contact 22 is formed, then the integrated circuit device 28 is trench isolated from adjacent devices. With reference to FIG. 5, there is shown a device 28 that is isolated by trenches 27, 29 from adjoining areas 26 and 30, 31. Likewise, trenches 25 and 32 isolate still further areas. Such trench isolation of surface device areas is well known in the art of forming silicon on insulator devices. It is noted that the contact 22 to the top plate 15 is itself isolated by trenches 29 and 32 from any adjoining silicon devices such as silicon device 28. The next step, as shown in FIG. 6, includes the filling of the isolation trenches 25, 27, 29 and 32 with an insulating material 40. The insulating material 40 may be any suitable material such as silicon dioxide or silicon nitride. In addition, those skilled in the art will recognize that a layer of insulating material such as silicon dioxide or silicon nitride may be deposited on the trench floor and walls or that silicon dioxide may be thermally grown on the walls of the trenches 25, 27, 29 and 32. With suitable sidewall and floor isolation, the trenches may then be filled with another material such as polysilicon. As such, FIG. 6 shows an essentially completed wafer that includes a plurality of silicon devices such as devices 28 and 26. The devices 28, 26 are isolated from each other. Moreover, the devices 28, 26 are likewise electrically isolated from surface capacitor contact 22. The surface capacitor contact 22 establishes electrical contact between the surface of wafer 18 and the top or second plate 15 of the capacitor. The balance of the capacitor is formed by the capacitor dielectric layer 12 and the first plate 11 which is integral with the handle wafer 10. The surface contact 22 may then be connected by one or more superior levels of metal to the power supply or ground/contacts (not shown) of device 28.

Those skilled in the art will also recognize that the bottom plate 11 of the capacitor may have a refractory metal silicide, such as $WSi_2$, $CoSi_2$ or $TiSi_2$ formed on the top surface 2 of the handle wafer 10. Likewise, the top plate 15 may also be a refractory metal silicide. This application can be used to provide an improved electrical contact between the top plate 15 and the conductive material 22 used to refill the trench and provide the electrical contact to surface 8. In addition, the refractory metal silicide on the surface of top plate 15 can provide an etch stop during the etch of trench 20.

Figure 7:
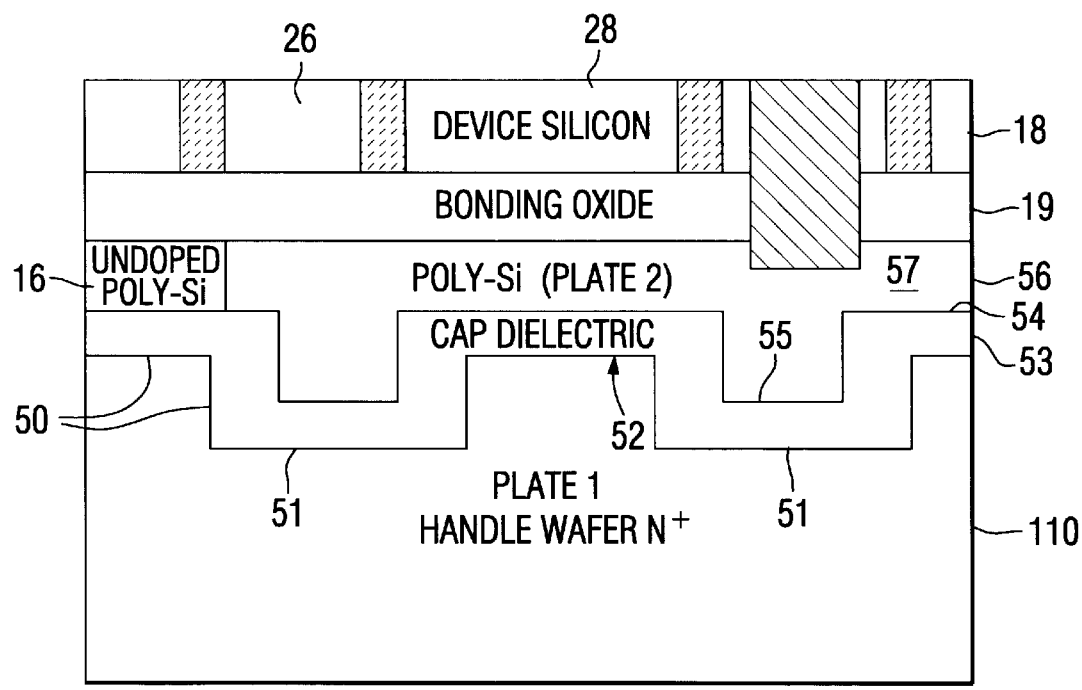
FIG. 7 shows an alternative embodiment of the invention.

Capacitance is increased by increasing the surface area of the plates of the capacitor. The surface area of the capacitor shown in FIG. 7 is greater than the surface area of the plates of the capacitor shown in FIG. 6. As seen in FIG. 7, the first plate 50 of the capacitor in handle wafer 110 is suitably patterned to provide a surface comprising a series of corrugations at different levels 51, 52. The capacitor dielectric 53 is conformally deposited over the corrugations 51, 52, and layer 56 of polysilicon is likewise conformally deposited over the dielectric layer 53. The polysilicon layer 56 is then planarized and polished for bonding with the bonding oxide layer 19 of the device wafer 18. Layer 56 is masked and suitably doped to provide second capacitor plate 57. The remaining steps in the formation of the devices 28, 26 and the surface contact 22 of the second capacitor plate 57 are the same as described above. It will be appreciated that the surface area of the corrugated capacitor formed by plate 57, capacitor dielectric 53, and plate 50 is substantially greater than the surface area of the capacitor shown in FIG. 6.

Figure 8:
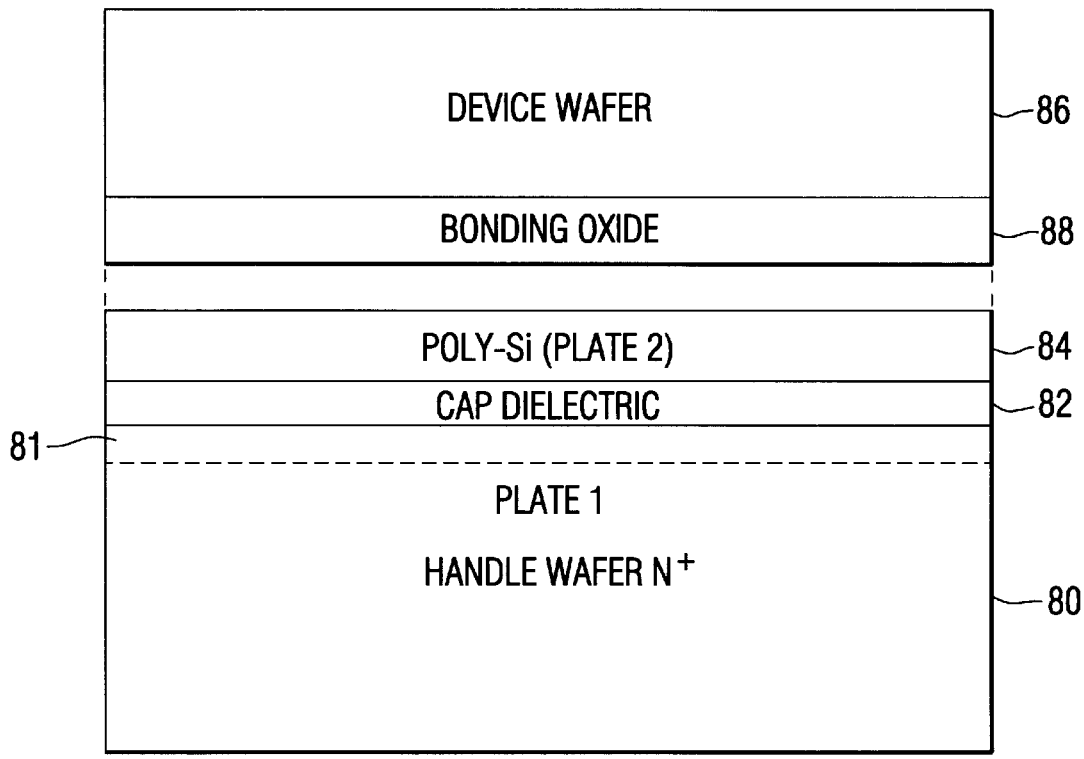
FIG. 8 shows a device and a handle wafer with a uniformly doped second plate.
Figure 9:
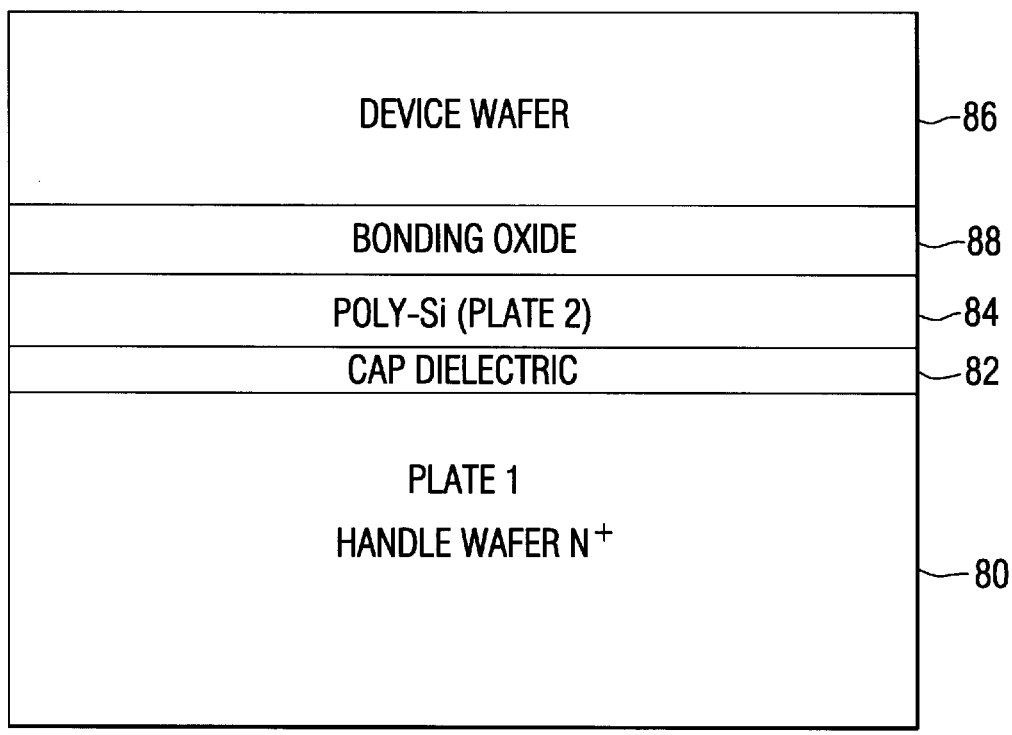
FIG. 9 shows the two wafers of FIG. 8 joined together.
Figure 10:
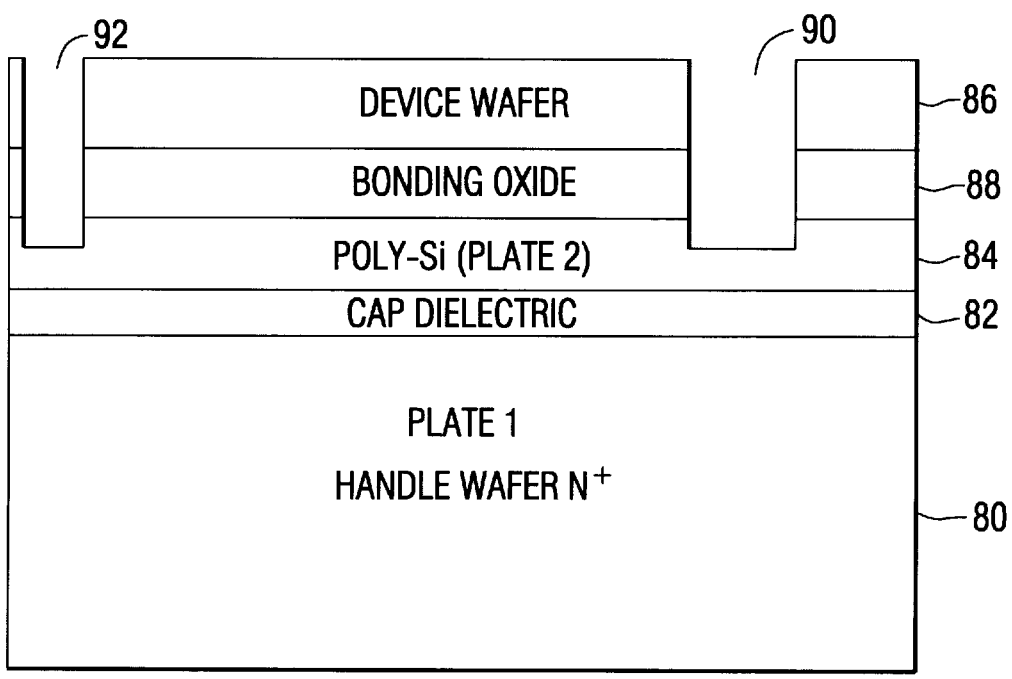
FIG. 10 shows a contact and an isolation trench step.

FIGS. 8–13 refer to another embodiment of the invention where the embedded capacitor is dielectrically isolated using surface trenches. With reference to FIG. 8, the handle wafer 80 has a first capacitor plate 81 on the top surface thereof. The handle wafer 80 may be any suitable material such as highly n-doped semiconductor material, in particular, monocrystalline silicon. The capacitor dielectric 82 may be an oxide, nitride, nitrex or diamond. Second or top plate 84, again, may be any suitable conductive material compatible with semiconductor processing, such as a polysilicon or a silicide, such as tungsten silicide. A device wafer 86 has a bonding layer 88. The device wafer 86 is also made of semiconductor material, in particular, monocrystalline silicon. The bonding layer 88 is typically silicon dioxide. As shown in FIG. 9, the wafers 86 and 80 are joined together in the same manner discussed above for the joining of the wafers 18 and 10. With reference to FIG. 10, two surface trenches 90, 92 are formed. The first trench 90 is a trench for forming a surface contact to the second plate 84 of the capacitor. The second trench 92, as explained hereinafter, will be used to protect and dielectrically isolate the capacitor, and, in particular, the second plate 84. As such, trench 92 extends around the entire periphery of each individual die on the device wafer and circumscribes all devices formed within the device wafer 86.

Figure 11:
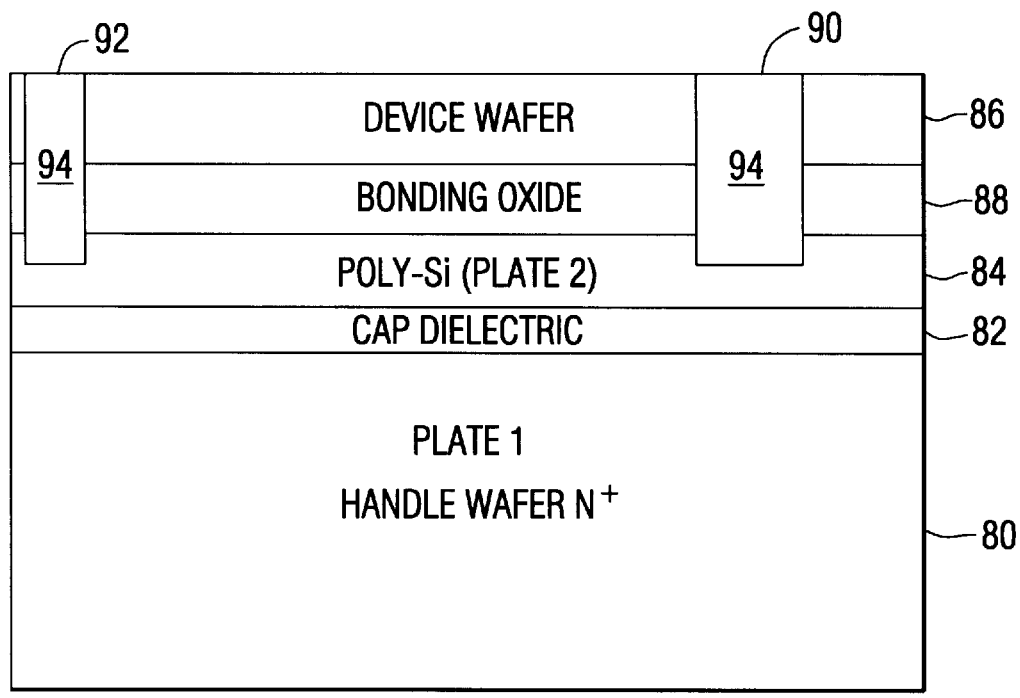
FIG. 11 shows a following step in the contact and isolation process.
Figure 12:
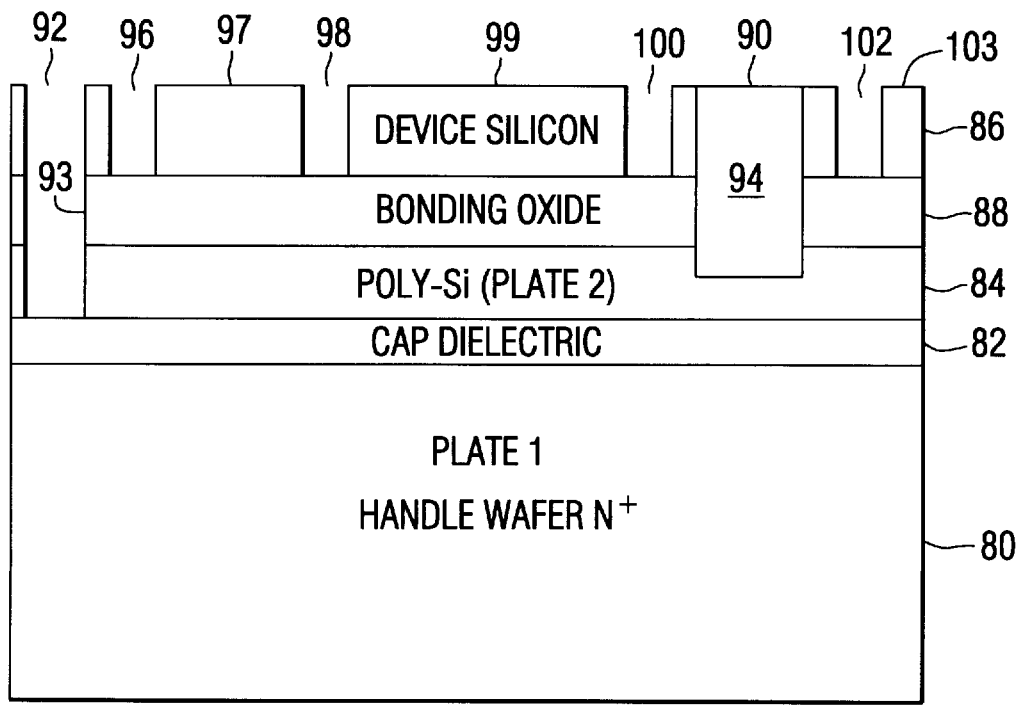
FIG. 12 shows a further isolation step.

The next step in the process is shown in FIG. 11. The trenches 90, 92 are filled with suitable conductive material, such as polysilicon, tungsten, or tungsten disilicide. Following that step, a trench isolation step is performed as shown in FIG. 12. There, device isolating trenches 96, 98, 100 and 102 are formed to isolate the device silicon. The trench 92 is further etched to remove the conductive material 94. Indeed, the etching is continued until the trench 92 extends to the capacitor dielectric 82. In order to extend the trench 92 to capacitor dielectric 82, it may be necessary to perform two masking steps so that the bonding oxide 88 exposed in the trenches 96, 98, 100 and 102 is isolated while the bonding oxide 88 in trench 92 is removed. However, with a very highly selective silicon, silicon dioxide etch, it is feasible to simultaneously trench etch both the refilled polysilicon material 94 in trench 92 and the silicon of the device wafer 86 for standard isolation trenches. The thickness difference between the polysilicon 94 and the device silicon 86 is no greater than the center to the edge device silicon thickness variation observed on those bonded wafers. In addition, the refilled, doped polysilicon 94 will mostly likely etch at a greater rate than the single crystal device silicon 86. Isolation of the contact plug 94 is accomplished during normal trench isolation.

Figure 13:
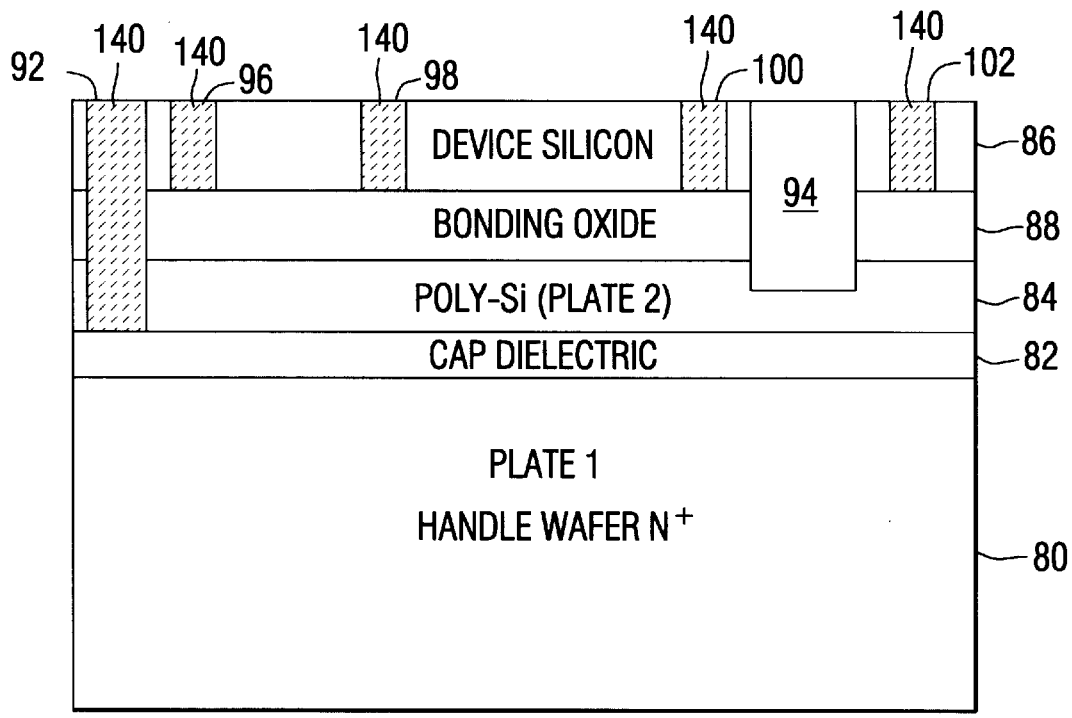
FIG. 13 shows the completion of an isolation step.

Thereafter, referring to FIG. 13, the trenches 92, 96, 98, 100 and 102 are simultaneously refilled with a dielectrically isolating material 140. As explained above, the material 140 may comprise silicon dioxide or silicon nitride. It is also possible to deposit a thin layer to cover the walls and the floors of the trenches 92, 96, 98, 100, 102 and then fill the rest of the trenches with polysilicon.

Figure 14:
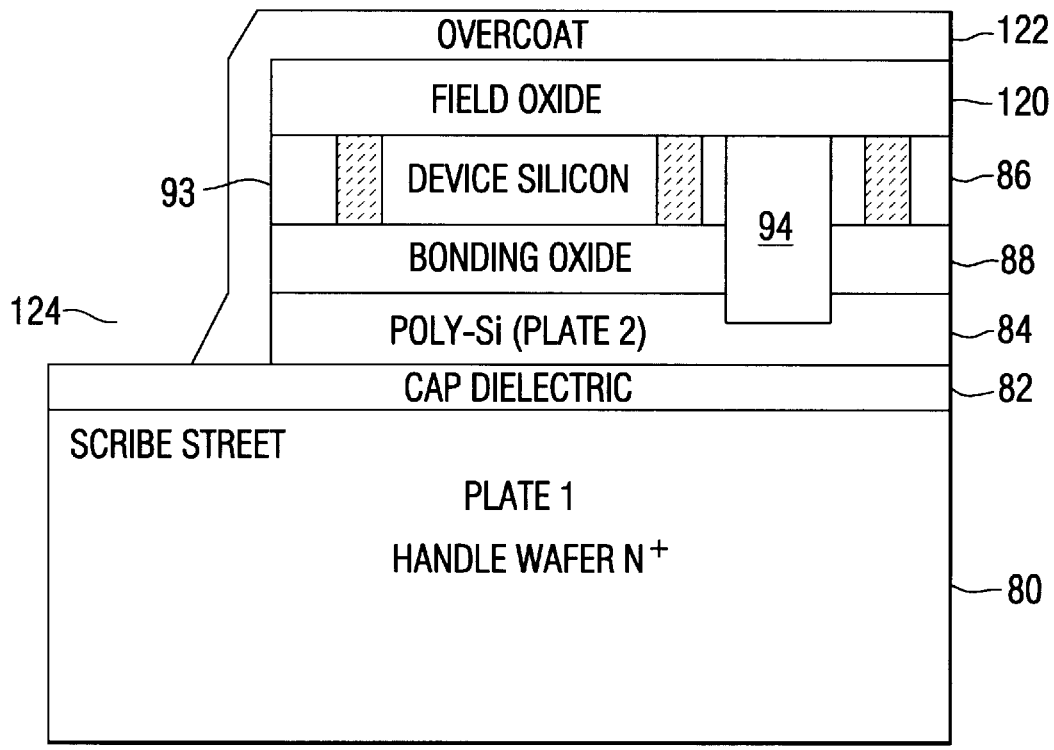
FIG. 14 shows an alternative isolation technique.
Figure 15:
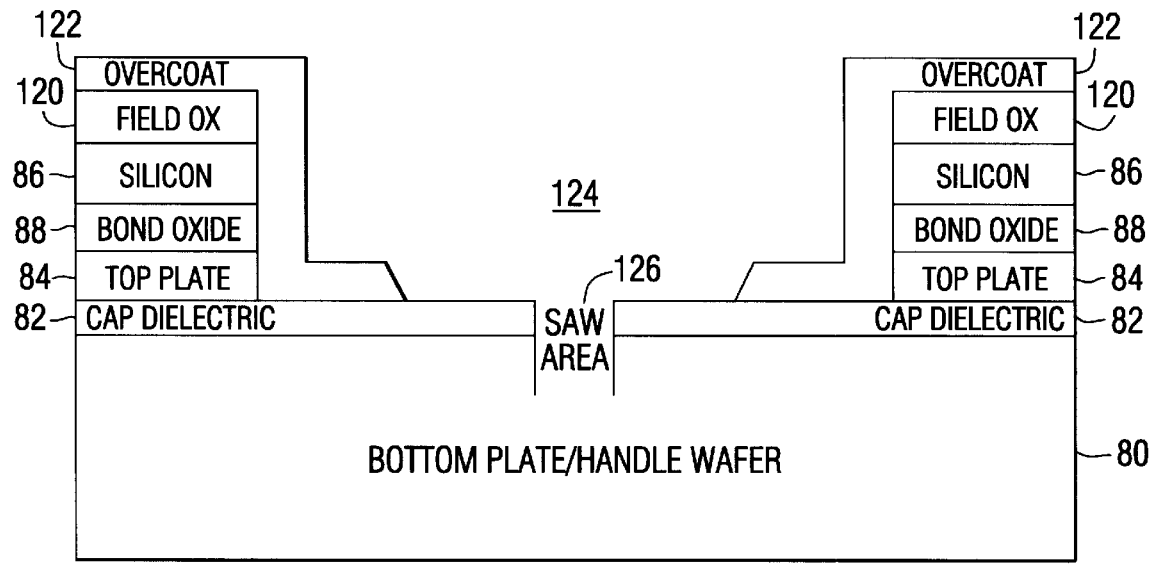
FIG. 15 shows a die separation step of the device of FIG. 14.

Still another alternative is shown in FIG. 14. There is shown a structure that can avoid an additional masking operation. Using the method illustrated in FIG. 14, it is also possible to clear the scribe streets and simultaneously isolate the second plate 84 of the capacitor. As such, FIG. 14 is similar in manufacture to the device shown in FIG. 13. However, instead of forming the trench 92, a much wider described street 124 is formed. The device silicon is covered with a field oxide layer 120 that is likewise etched to form the scribe street 124. After formation of scribe street 124, an overcoat protective layer 122, such as silicon nitride, covers the edge 93 of the device silicon layer 86, the bonding layer 88 and the second or top plate 84 of the capacitor. In this way, an isolation overcoat 122 surrounds the top plate of the capacitor 84 thereby isolating it from potential short circuits after die separation. With reference to FIG. 15, the device of FIG. 14 is shown during further processing where a dicing saw is passed through a dicing saw area 126 to separate the devices on the right hand side of the figure from those on the left hand side of the figure.

Figure 16:
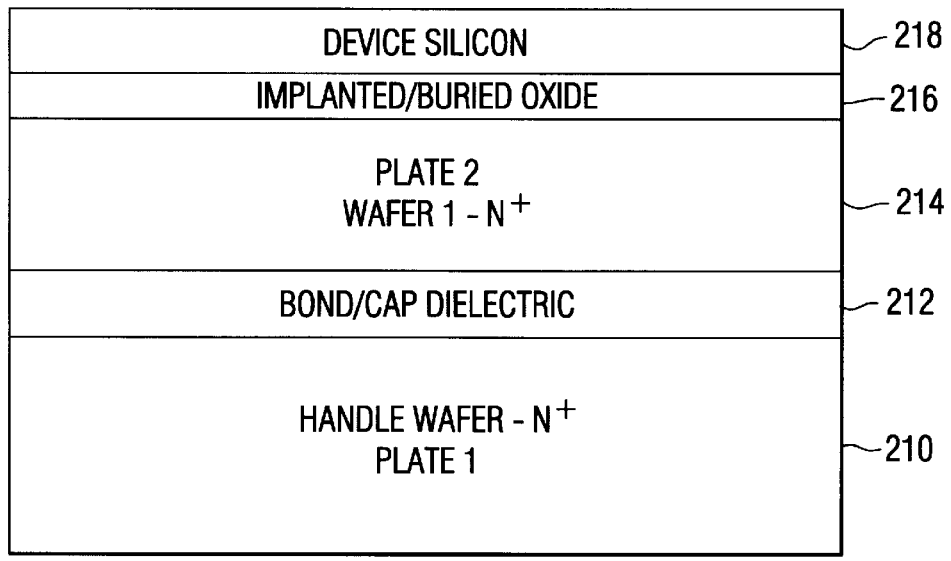
FIG. 16 shows an alternative embodiment for a buried capacitor.

With reference to FIG. 16, there is shown an embodiment of the invention in a SIMOX wafer. The SIMOX wafer 214 has an implanted buried oxide region 216 above which a silicon device layer 218 includes an integrated circuit. The heavily p or n-doped SIMOX wafer 214 forms the second or upper plate of the capacitor. A suitable handle wafer 210, as described above with a bonding and capacitor dielectric 212 is suitably bonded to the SIMOX wafer 214 in a manner well known in the art.

Having thus described the preferred embodiments of the invention, those skilled in the art will understand that further modifications, additions, changes and alterations may be made thereto without departing from the spirit and scope of the invention as set forth in the following claims:

What we claim is:

1. A bonded integrated circuit with an embedded capacitor comprising:
    a device substrate having an integrated circuit comprising a plurality of semiconductor devices;
    a handle substrate for supporting all of the devices in the device substrate and comprising a top surface doped to form a first capacitor plate;
    a capacitor comprising a capacitor dielectric on the first capacitor plate and a second capacitor plate on the capacitor dielectric; and
    a bonding layer over and between the capacitor and the device substrate for bonding the capacitor and the handle substrate to the device substrate so that the handle substrate supports all the devices in the device substrate.

2. The bonded integrated circuit of claim 1 wherein the bonding layer is on the second capacitor plate.

3. The bonded integrated circuit of claim 2 wherein the device substrate and the second capacitor plate are silicon and the bonding layer is silicon dioxide.

4. The bonded integrated circuit of claim 3 comprising a layer of polysilicon having a doped region surrounded by an undoped region wherein the second capacitor plate comprises the doped region.

5. The bonded integrated circuit of claim 1 further comprising a surface contact disposed on the surface of the device substrate and in electrical contact with the second plate of the capacitor.

6. The bonded integrated circuit of claim 5 further comprising a trench extending from the surface of the device substrate to the second plate of the capacitor, said trench comprising a conductive material extending from the second plate of the capacitor to the surface of the device wafer.

7. The bonded integrated circuit of claim 6 wherein the trench is filled with a material selected from the group consisting of doped polysilicon, tungsten, and tungsten silicide.

8. The bonded integrated circuit of claim 1 wherein the integrated circuit is surrounded by a trench comprising insulation material.

9. The bonded integrated circuit of claim 1 wherein the first capacitor plate has a plurality of first and second planar surfaces parallel to each other and spaced from each other.

10. The bonded integrated circuit of claim 9 wherein the said first and second planar surface form a corrugated surface of parallel grooves and ridges.

11. The bonded integrated circuit of claim 1 wherein the second plate comprises a material selected from the group consisting of polysilicon, and a silicide of a conductive material.

12. The bonded integrated circuit of claim 1 further comprising a capacitor isolation trench extending from the surface of the device substrate to the second capacitor plate, surrounding a portion of the second capacitor plate and filled with insulation material.

13. The bonded integrated circuit of claim 12 wherein said capacitor isolation trench extends to said capacitor dielectric.

14. The bonded integrated circuit of claim 1 further comprising an insulating overcoat layer surrounding the second capacitor plate.

15. The bonded integrated circuit of claim 1 wherein a capacitor isolation trench extends to said capacitor dielectric.

16. The bonded integrated circuit of claim 1 further comprising an insulating overcoat layer surrounding the second capacitor plate.

17. The bonded integrated circuit of claim 1 wherein the handle substrate consists essentially of monocrystalline silicon with said one surface forming the first capacitor plate.

18. An integrated circuit with an embedded capacitor comprising:
    a handle substrate for supporting all semiconductor devices in a superior device substrate, said handle substrate having a top surface doped to form a first capacitor plate;
    a dielectric covering the first plate;
    a second plate covering the dielectric;
    a device substrate with an upper surface, a lower surface, and an integrated circuit formed in the upper surface and comprising a plurality of semiconductor devices all supported by said handle substrate, the lower surface of said device substrate covering the second plate;
    a bonding layer between the lower surface and the second plate; and
    a surface contact in contact with the upper surface of the device substrate and extending from the upper surface of the device substrate to the second plate.

19. The integrated circuit of claim 18 wherein the handle substrate consists essentially of monocrystalline silicon with said one surface forming the first capacitor plate.

20. An integrated circuit with a capacitor embedded beneath the integrated circuit comprising:
    a handle substrate for supporting all semiconductor devices in a superior device layer, said handle substrate having a top surface doped to form a first capacitor plate, said first capacitor plate comprising a surface having a plurality of grooves and ridges to form a corrugated surface for said first capacitor plate;
    a dielectric conformally covering the grooves and ridges of the first plate; a second plate covering the dielectric and having a planar upper surface;
    a device substrate with an upper surface, a lower surface, and an integrated circuit having a plurality of semiconductor devices formed in the upper surface, said semiconductor devices all supported by said handle substrate and the lower surface of said device substrate covering the second plate;
    a bonding layer between the lower surface covering the second plate; and
    a surface contact in contact with the upper surface of the device substrate and extending from the upper surface of the device substrate to the second plate.

21. The integrated circuit of claim 20 wherein the handle substrate consists essentially of monocrystalline silicon with said one surface forming the first capacitor plate.

22. A SIMOX device with an embedded capacitor comprising:
    a handle substrate for supporting all semiconductor devices in a superior device substrate and having a top surface doped to form a first plate of the embedded capacitor;
    a bonding layer comprising a dielectric material and covering the first plate;
    a device substrate comprising plurality of semiconductor devices all supported by the handle substrate and further comprising a heavily doped semiconductor material having upper and lower surfaces with the lower surface in contact with the bonding layer and forming a second plate of the embedded capacitor;

a layer of oxide disposed beneath the upper surface of said device substrate;

an integrated circuit formed in the upper surface of the device substrate;

a surface contact in contact with the upper surface of the device substrate and extending from the upper surface of the device substrate to the second plate.

23. The integrated circuit of claim 22 wherein the handle substrate consists essentially of monocrystalline silicon with said one surface forming the first capacitor plate.

* * * * *